US009748300B2

(12) United States Patent
Van Veen et al.

(10) Patent No.: US 9,748,300 B2
(45) Date of Patent: Aug. 29, 2017

(54) RADIATION DETECTOR ELEMENT

(71) Applicant: KONINKLIJKE PHILIPS N.V., Eindhoven (NL)

(72) Inventors: Nicolaas Johannes Anthonius Van Veen, Geldrop (NL); Rafael Goshen, Haifa (IL); David Yogev, Nesher (IL); Amir Livne, Zichron Ya'Aqov (IL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/407,325

(22) PCT Filed: Sep. 4, 2014

(86) PCT No.: PCT/EP2014/068852
§ 371 (c)(1),
(2) Date: Dec. 11, 2014

(87) PCT Pub. No.: WO2015/032865
PCT Pub. Date: Mar. 12, 2015

(65) Prior Publication Data
US 2016/0276387 A1    Sep. 22, 2016

(30) Foreign Application Priority Data

Sep. 5, 2013  (EP) .................................. 13183184

(51) Int. Cl.
*H01L 27/14* (2006.01)
*H01L 27/30* (2006.01)
(Continued)

(52) U.S. Cl.
CPC ........ *H01L 27/14634* (2013.01); *H01L 24/09* (2013.01); *H01L 24/16* (2013.01);
(Continued)

(58) Field of Classification Search
CPC .................................................. H01L 27/14634
(Continued)

(56) References Cited

U.S. PATENT DOCUMENTS 5,492,266 A * 2/1996 Hoebener ................ B23K 3/06
228/180.22
5,899,737 A   5/1999 Trabucco
(Continued)

FOREIGN PATENT DOCUMENTS

JP    2000012587    1/2000
JP    2005286166    10/2005
(Continued)

OTHER PUBLICATIONS

Muonio, et al., "Solder Ball Attachment Using Laser Soldering", Circuits Assembly, Oct. 2008.

*Primary Examiner* — Moazzam Hossain

(57) ABSTRACT

The present invention generally relates to a radiation detector element wherein a photodiode is transversely fixed to a detector element substrate through at least one connection comprising two fused solder balls, wherein a first of the two fused solder balls contacts the photodiode and a second of the two fused solder balls (contacts the detector element substrate. The invention further relates to a method of transversally attaching two substrates, in particular constructing the above-mentioned radiation detector element. It also relates to an imaging system comprising at least one radiation detector element.

8 Claims, 3 Drawing Sheets

(51) Int. Cl.
*H01L 21/48* (2006.01)
*H01L 27/146* (2006.01)
*H01L 25/04* (2014.01)
*H01L 23/00* (2006.01)

(52) U.S. Cl.
CPC ............ *H01L 24/17* (2013.01); *H01L 25/042* (2013.01); *H01L 25/043* (2013.01); *H01L 27/1469* (2013.01); *H01L 27/14623* (2013.01); *H01L 27/14661* (2013.01); *H01L 27/14663* (2013.01); *H01L 2224/091* (2013.01); *H01L 2224/09165* (2013.01); *H01L 2224/16105* (2013.01); *H01L 2224/16113* (2013.01); *H01L 2224/16148* (2013.01); *H01L 2224/16505* (2013.01); *H01L 2224/16506* (2013.01); *H01L 2224/171* (2013.01); *H01L 2224/81047* (2013.01); *H01L 2224/81224* (2013.01); *H01L 2224/81801* (2013.01); *H01L 2225/06551* (2013.01); *H01L 2924/0002* (2013.01); *H01L 2924/0105* (2013.01); *H01L 2924/01049* (2013.01); *H01L 2924/01083* (2013.01); *H01L 2924/12043* (2013.01)

(58) Field of Classification Search
USPC ......................................................... 257/417
See application file for complete search history.

(56) References Cited

U.S. PATENT DOCUMENTS

| | | | | |
|---|---|---|---|---|
| 5,963,793 A * | 10/1999 | Rinne | ............... | H01L 24/10 257/E23.021 |
| 6,140,696 A | 10/2000 | Kinsman | | |
| 6,362,480 B1 * | 3/2002 | Peter | ............... | G01T 1/2018 250/366 |
| 7,604,153 B2 * | 10/2009 | MacKay | ............... | B23K 1/0016 228/248.1 |
| 7,968,853 B2 | 6/2011 | Altman et al. | | |
| 8,361,881 B2 | 1/2013 | Zakel et al. | | |
| 8,471,154 B1 * | 6/2013 | Yoshida | ............... | H01L 23/3128 174/260 |
| 2002/0121687 A1 * | 9/2002 | Winderl | ............ | H01L 23/49816 257/686 |
| 2003/0127600 A1 | 7/2003 | Vafi et al. | | |
| 2004/0253803 A1 * | 12/2004 | Tomono | ............... | H01L 21/563 438/614 |
| 2005/0167603 A1 * | 8/2005 | Hoffman | ............... | G01T 1/2018 250/370.11 |
| 2006/0208041 A1 * | 9/2006 | MacKay | ............... | B23K 1/0016 228/254 |
| 2007/0007461 A1 * | 1/2007 | Yanada | ............... | G01T 1/2018 250/370.11 |
| 2008/0205017 A1 | 8/2008 | Nellissen et al. | | |
| 2009/0102030 A1 * | 4/2009 | Khan | ............... | H01L 21/56 257/675 |
| 2009/0202244 A1 * | 8/2009 | Jin | ............... | G02B 6/4201 398/67 |
| 2010/0148039 A1 * | 6/2010 | Gratz | ............... | G01T 1/00 250/214 R |
| 2010/0171206 A1 * | 7/2010 | Chu | ............... | H01L 21/565 257/686 |
| 2010/0200760 A1 * | 8/2010 | Baeumer | ............... | H01L 27/1446 250/366 |
| 2010/0246919 A1 * | 9/2010 | Wainer | ............... | G01T 1/17 382/131 |
| 2011/0132879 A1 | 6/2011 | Matsumoto et al. | | |
| 2011/0135052 A1 * | 6/2011 | Proksa | ............... | A61B 6/032 378/5 |
| 2012/0006992 A1 * | 1/2012 | Yanada | ............... | G01T 1/2018 250/366 |
| 2012/0049375 A1 | 3/2012 | Meyer et al. | | |
| 2012/0049376 A1 | 3/2012 | Harada et al. | | |
| 2012/0205765 A1 | 8/2012 | Hynecek | | |
| 2013/0015578 A1 | 1/2013 | Thacker et al. | | |
| 2013/0248723 A1 * | 9/2013 | Virshup | ............... | G01T 1/2018 250/362 |
| 2014/0321609 A1 * | 10/2014 | Levene | ............... | G01T 1/2018 378/19 |
| 2015/0059963 A1 * | 3/2015 | Nitta | ............... | G01T 1/20 156/154 |

FOREIGN PATENT DOCUMENTS

| | | |
|---|---|---|
| JP | 2012018062 | 1/2012 |
| WO | 2012/104775 | 8/2012 |
| WO | 2013080105 A2 | 6/2013 |

\* cited by examiner

RADIATION DETECTOR ELEMENT

CROSS-REFERENCE TO PRIOR APPLICATIONS

This application is the U.S. National Phase application under 35 U.S.C. §371 of International Application No. PCT/EP2014/068852, filed on Sep. 4, 2014, which claims the benefit of European Patent Application No. 13183184.4, filed on Sep. 5, 2013. These applications are hereby incorporated by reference in their entirety herein.

FIELD OF THE INVENTION

The present invention generally relates to a radiation detector element and a method of constructing a radiation detector element. It also relates to an imaging system comprising at least one radiation detector element. Furthermore it relates to a transversal attachment method.

BACKGROUND OF THE INVENTION

Detectors for detecting electromagnetic radiation such as x-rays or visible light are used in many applications, including medical and security imaging, astrophysics and cameras. One example of a radiation detector is disclosed in U.S. Pat. No. 7,968,853. The so-called 'double decker detector' described therein comprises a two-dimensional array of stacked scintillators facing an x-ray source. Active areas of photodiodes are optically coupled to the stacked scintillators. The photodiodes and scintillators are oriented transversely with respect to a substrate, which usually is in connection with application-specific integrated circuits (ASICs) and output electronics.

The photodiodes are supported by the substrate through electrically conducting connections. This requires a high precision combined with sufficient mechanical strength. Known connections comprise a metallic spike (usually a series of stacked stud bumps) attached to the photodiode which penetrates into a deposit of conductive adhesive on the substrate. However, it has proven to be a challenge to construct sufficiently accurate and reliable connections that are mechanically strong and/or without poor contacts, opens and shorts using this construction method, while maintaining sufficient flexibility to withstand mechanical, thermal and rotational stresses.

These issues are also often encountered with other (micro)-electronic or (micro)-mechanic applications wherein pieces need to be reliable fixed in a transverse orientation with respect to each other.

SUMMARY OF THE INVENTION

The present invention provides a radiation detector element comprising at least one photodiode having a first main surface extending along a first main axis and a detector element substrate having a second main surface extending along a second main axis which is oriented transversally with respect to the first main axis, wherein the photodiode is in electrical contact with the detector element substrate through at least one connection, wherein the connection comprises two fused solder balls, wherein a first of each of the two fused solder balls contacts the photodiode and a second of each of the two fused solder balls contacts the detector element substrate. Such a radiation detector element is sturdily constructed, wherein the photodiode is transversely connected to the detector element with electrically reliable and mechanically strong, yet sufficiently flexible connections.

In an embodiment of the radiation detector element of the present invention the first main axis of the photodiode is oriented substantially perpendicular with respect to the second main axis of the detector element substrate. According to an embodiment of the radiation detector element of the present invention the first main surface lies in a first plane and the second main surface lies in a second plane, wherein the first plane and second plane are aligned transversely with respect to each other. In further embodiment of the radiation detector element of the present invention comprise a scintillating material coupled to the photodiode, wherein the scintillating material preferably comprises two stacked scintillating layers. Another embodiment of the radiation detector element of the present invention comprises a radiation shielding element coupled to the photodiode, preferably a shielding element comprising tungsten. In another embodiment the radiation detector element of the present invention comprises at least 32 connections, preferably comprising at least 36 connections, and, comprising at least 16 photodiodes. These embodiments, individually or combined, are similar to known radiation detector elements, but with an improved connection between the photodiode and the detector element substrate. In another embodiment of the radiation detector element of the present invention a composition of the first solder ball and/or the second solder ball comprises Bismuth, preferably a Bismuth-Tin alloy. Solder balls with this composition are particularly suitable, since this composition has a relatively low melting temperature, such that operating temperatures or high temperature exposure to melt the solder balls can be kept as low as possible during manufacture or processing, such that surrounding materials and structures are not degraded, as well as reducing energy costs. Furthermore, a desired mechanical strength can be obtained by varying a Bismuth content. Even more preferable the Bismuth-Tin alloy would be a Bismuth-Tin-Indium alloy, since Indium lowers the melting temperature even further.

The present invention is further directed towards a medical imaging device comprising at least one radiation detector element according to the present invention. The medical imaging device may be a computed tomography device. Such a medical imaging device has more reliable detector elements, which may reduce construction costs and possible future repair or replacement costs or increase lifetime of the device.

The present invention is further directed towards a method for constructing a radiation detector comprising at least one photodiode having a first main surface extending along a first main axis and a detector element substrate having a second main surface extending along a second main axis; the method comprising the steps of applying a first solder ball to the first main surface of the photodiode; applying a second solder ball to the second main surface of the detector element substrate; flattening said first solder ball and/or said second solder ball; positioning the photodiode such that the first main axis is oriented transversally, at an angle $\alpha$, with respect to the second main axis, wherein the first solder ball and the second solder ball are placed in proximity with respect to each other, such that the first solder ball will wet the second solder ball when it expands upon a heating; heating the first solder ball and the second solder ball to a temperature above the melting point of the first solder ball and the second solder ball. This method provides a radiation detector element that is sturdily constructed, wherein the photodiode is transversely connected to the detector element with electrically reliable and mechanically strong, yet sufficiently flexible connections.

An embodiment of the method for constructing a radiation detector comprises applying a scintillating layer and/or a shielding layer to the photodiode to result in a photodiode that is similar to known radiation detector elements, but with an improved connection between the photodiode and the detector element substrate. In a further embodiment of the method for constructing a radiation detector the angle α is between 80° and 90°, preferably between 85° and 90°, more preferably between 89° and 90° and most preferably between 89.5° and 90°. By off-setting the angle α, a shrinkage of the solder balls due to heating is taken into account to arrive at a photodiode that is nearly perfectly aligned perpendicularly with respect to detector element substrate according to a preferred embodiment of the radiation detector element according to the present invention.

The present invention is further directed towards a method to transversely attach a first piece to a second piece, wherein the first piece has a first main surface extending along a first main axis and the second piece has a second main surface extending along a second main axis; the method comprising the steps of applying a first solder ball to the first main surface of the first piece; applying a second solder ball to the second main surface of the second piece; flattening said first solder ball and/or said second solder ball; positioning the first piece such that the first main axis is oriented transversely, at an angle α, with respect to the second main axis, wherein the first solder ball and the second solder ball are placed in proximity with respect to each other, such that the first solder ball will wet the second solder ball when it expands upon a heating; heating the first solder ball and the second solder ball to a temperature above the melting point of the first solder ball and the second solder ball. With this method two pieces may be sturdily attached transversely with respect to each other with electrically reliable and mechanically strong, yet sufficiently flexible connections.

In embodiments of both main methods the step of flattening the first solder balls and/or second solder ball comprises pressing the first and/or second solder ball, preferably heated pressing at a temperature below the melting temperature of the first and/or second solder ball or solder balls to be pressed. Pressing at temperatures between ambient temperature and just below melting temperature of the solder balls result in a flattening step that is as little thermally taxing on surrounding materials and structures. Pressing can be done with less mechanical strength if pressing occurs at elevated temperatures (but below the melting temperature(s) of the solder balls), which reduces risks of possible damage due to pressing. In further embodiments of both main methods the first solder ball and the second solder ball have a diameter smaller than 500 microns, preferably approximately 300 microns. Commercially available solder balls with such a diameter are readily available. In further embodiments of both main methods the step of heating comprises laser heating. This allows for exact, local and well-timed heating of the solder balls with as little heat exposure to surrounding materials and structures. In further embodiments of both main methods there are at least two first solder balls and at least two second solder balls which in the step of heating are heated simultaneously. This allows for a fast process and a reduced throughput time.

In further embodiment of both main methods the solder ball may be flattened to approximately a third of an original solder ball diameter. This allows for a good balance between necessary pressing conditions and wetting properties upon heating.

Still further aspects and embodiments of the present invention will be appreciated by those of ordinary skill in the art upon reading and understanding the following detailed description. Numerous additional advantages and benefits will become apparent to those of ordinary skill in the art upon reading the following detailed description of preferred embodiments.

The invention may take form in various components and arrangements of components, and in various process operations and arrangements of process operations. The drawings are only for the purpose of illustrating preferred embodiments and are not to be construed as limiting the invention. To better visualize certain features may be omitted or dimensions may be not be according to scale.

DETAILED DESCRIPTION OF EMBODIMENTS

In the following, various aspects of the present invention are explained using a scintillator-based detector for a computed tomography device as a non limitative example. The skilled person would understand that the present invention is not limited to this example, but may be extended widely to cover other medical and non-medical imaging devices and other radiation detectors, including direct conversion detectors and optical radiation detectors. Even more generally, the described construction methods may be relevant for other (micro)-electronic and (micro)-mechanical devices in which there is a need for a reliable transversal attachment of two pieces, such as single-in-line memories for microprocessors.

Figure 1:
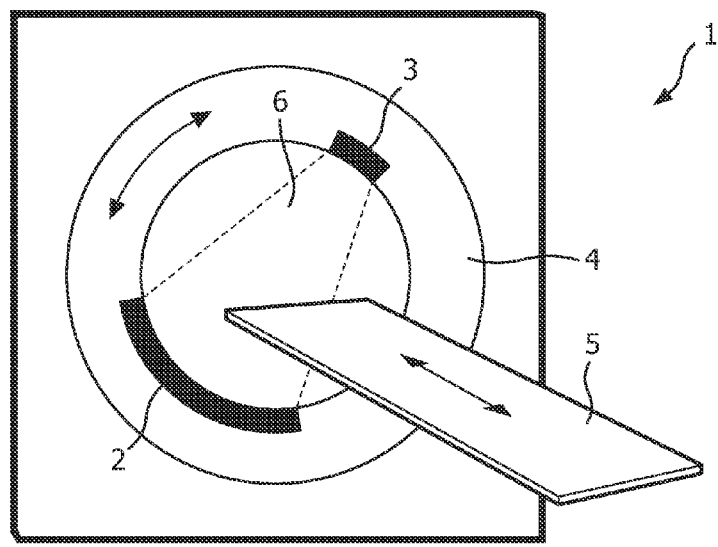
FIG. 1 shows a schematic depiction of a medical imaging device, specifically a computed tomography device (prior art).

FIG. 1 shows a schematic depiction of a medical imaging device, more particularly a computed tomography device 1. An x-ray radiation detector 2 and an x-ray source are mounted on a rotatable gantry 3. A subject to be scanned, such as a patient, is positioned on movable bench 5, which during scanning moves through examination region 6, while gantry 3 rotates around the examination area and x-ray source 3 emits x-ray radiation. The x-ray radiation which passes through the subject is detected by x-ray detector 2, in which the detected x-ray radiation is converted to electronic information that is further processed in further processing equipment (not shown) to visual information which is displayed to a user, such as a physician.

Detector 2 may convert x-ray radiation into electronic information using various different principles, such as scintillation, in which x-ray radiation is converted into radiation at another wavelength. The radiation is then fed into an optically coupled photodiode, which reemits the radiation as electrons (the photoelectric effect). An alternative conversion method is direct conversion, in which x-rays are directly converted into electrons in a direct conversion material (such as Cadmium Zinc Telluride or Cadmium Telluride). In some configurations scintillators, photodiodes and/or direct conversion layers are oriented transversely (usually substantially vertically) with respect to a substrate for various reasons (e.g. improved radiation trapping, pixel size reductions, etc.). The electronic information is electrically transmitted to the substrate, from which it is further transmitted to the further processing equipment. Therefore, the vertical pieces need to be in reliable electrical contact at discrete locations with the substrate. At the same time mechanical connections between the vertical piece and the substrate needs to be sturdy. This is not trivial, since the vertical piece usually does not directly contact the substrate (to avoid electrical shorts), but is only connected through a series of connections. These connections need to be electrically conducting and mechanically strong, yet sufficiently flexible to hold the weight and resist potential rotation of the vertical piece.

Figure 2:
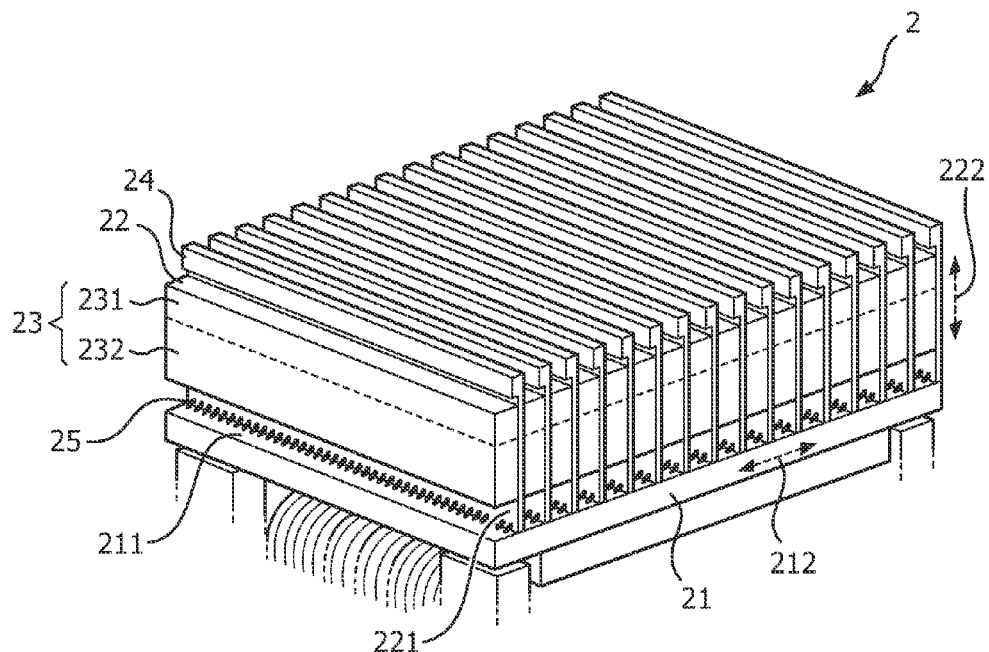
FIG. 2 shows a schematic perspective view of a radiation detector according to the present invention.
Figure 3:
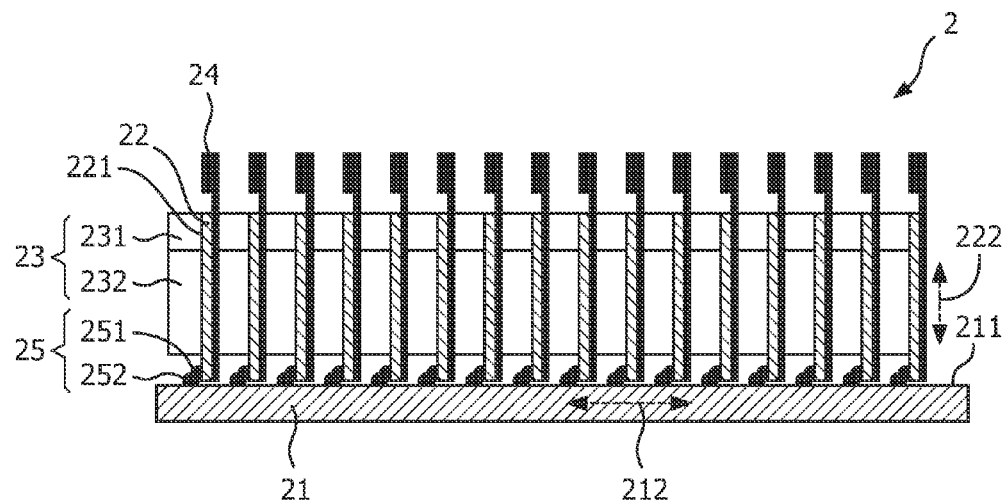
FIG. 3 shows a schematic side view of a radiation detector according to the present invention.

An example of a photodetector 2 is shown in FIGS. 2 and 3. These figures both depict an active part of a so-called double-decker detector element in schematic perspective and side view respectively. A photodetector usually comprises several of these detector elements. As can be seen as a non limitative example, such a photodetector comprises a substrate 21. The substrate may be coupled to further processing equipment (such as an ASIC) and to mounting means to mount the detector element on another structure, such as the gantry 4, and further electric wiring and connections. The photodetector further comprises a photoconversion element, in this example a scintillator 23, and shielding elements 24. X-ray radiation is detected using a scintillator stack 23, which comprises two vertically stacked scintillators 231, 232, each sensitive to x-ray radiation with a different wavelength. The scintillator stack 23 is optically coupled to photodiode 22. A shielding element 24 (usually a tungsten shielding element) may be attached to the photodiode 22 to shield the photodiode 22 itself from direct x-ray irradiation (to avoid direct conversion of x-rays within the photodiode). The shielding element 24 is usually attached to a side of the photodiode that is opposite to the side facing the scintillator 23. The shielding element usually extends beyond and over the top of the photodiode 22 to optimally shield the photodiode 22 from direct irradiation. The photodiode 22 is coupled to the detector element substrate 21 through a row of n connections 25, wherein each connection may be electrically conductive; n may range from 1 to at least 32, since this provides sufficient connections and connective strength. Most preferable, n is 36 to allow for further electrical or non-electrical contacts. The connections are preferable substantially evenly spaced on a main surface of the photodiode 22. The terms 'evenly spaced' and 'substantially evenly spaced' should be understood in the context of this invention as having a same distance between two objects with a variation of up to 10%, preferably with a variation of up to 5%, more preferably with a variation of up to 2% and most preferably with no variation, wherein the variation may be in either direction (shorter or longer distances). An orientation of a main axis 422 of a main surface 421 of the photodetector 22 is transverse, preferably substantially perpendicular, with respect to a main axis 411 of a main surface 412 of the detector element 21. Said orientation is preferably exactly 90 degrees, but may have a maximum variation of 1 degree to either side to still obtain a well-working photodetector.

A detector element 2 normally comprises at least one photodiode, but usually comprises a parallel row of p scintillators, photodiodes and shielding elements on one detector element substrate 21, wherein p ranges from 2 to at least 16; p is preferably 16, but may also be higher or lower.

As can be seen most clearly in FIG. 3, in this example the substrate 21 and the photodiode 22 are only connected through the connections 25 and are not in direct physical contact with each other. Therefore the mechanical burden is fully on the connections 25, which need to have sufficient strength, but still need to be slim and allow for some elasticity.

In this particular embodiment the photodiodes 22 are each 6 mm high, 18 mm wide and 100 micron thick, p is 16, n is 36 and the connections 25 are all electrically conductive connections according to the present invention that are evenly spaced with a spacing of 500 microns with a variation of less than 1%. This results in a particularly well-tested embodiment, but the present invention certainly allows for scaling towards smaller (or larger) solder ball dimensions and/or spacings. In this embodiment the photodiodes 22 are perpendicularly oriented with respect to the substrate 21 at an angle between 89.5 and 90.5 degrees.

Figure 4:
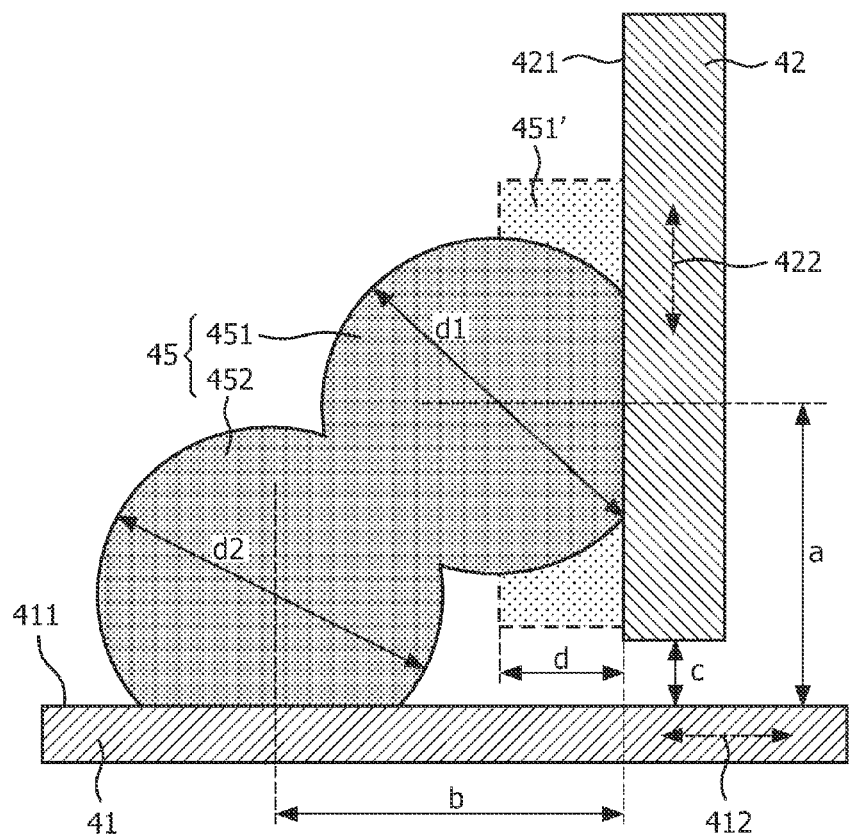
FIG. 4 shows a schematic side view of a structure comprising two pieces that are transversely attached by two fused solder balls according to a method of the present invention.

FIG. 4 depicts a close-up of a connection 25. A single connection 25 comprises fused solder balls 45 fused from a first solder ball 451 and a second solder ball 452. In the context of this invention the terms 'first solder ball' and 'second solder ball' may mean non-fused separate first and second solder balls, as well as portions of a fused solder ball that generally correspond to the original respective first and second solder balls. It may also be used in the context of this invention for flattened ('coined') first or second solder balls. The fused solder balls 45 each contact the main surface 421 of piece 42 (which is photodiode 22 in this particular example) with first solder ball 451 of the fused solder ball 45 and the main surface 411 of the substrate 41 (which corresponds to detector element substrate 21 in this example) with second solder ball 452 of the fused solder ball 45. The term solder balls is a commonly known term in the field for which the skilled person would understand that the original solder balls have a substantially spherical shape, but that each solder ball may have a somewhat less perfectly spherical shapes, such as somewhat flattened or oblong shapes. Also, in the context of this invention the term 'solder ball' specifically includes suitable thermally meltable or fusible balls that would normally not be associated with a soldering process (e.g. non-metal balls, such as organic (e.g. polymeric) balls or inorganic (e.g. ceramic) balls).

In principle, the connections 25 may be composed of any material, such as commonly used Tin-Silver-Copper (SAC) alloys. However, due to a limited resistance to high temperatures of several materials in micro-electronics and specifically in radiation detectors, it is preferred that connections 45 have a composition that has a relatively low meting temperature. Particularly suitable solder ball compositions comprise Bismuth, such as Bismuth-Indium (BiIn), Bismuth-Tin (BiSn) or Bismuth-Tin-Indium (BiSnIn), wherein an amount of Bismuth generally determines a mechanical strength (more Bismuth generally means a higher mechanical strength). Preferably eutectic compositions are used. Eutectic BiSn is most preferable, since this has a relatively low melting point (140 degrees Celsius) while still maintaining high strength. Addition of Indium to BiSn allows using even lower melting solders. It is not required, that the composition of the first solder balls 451 is the same as or similar to the composition of second solder balls 452. In an embodiment of the present invention the composition of the to-be-coined solder ball has a lower melting temperature (e.g. BiSnIn) than that of the other solder ball (which, for instance has a BiSn composition). This allows for more control on coining, melting and/or fusing conditions and properties after coining, melting and/or fusing.

Solder balls 451 and 452 that are fused to fused solder balls 45 may have any dimension suitable for a particular connection. However, if the solder balls are too large, a high temperature or a long heating period may be necessary to properly fuse them together, which may degrade some of the other materials. Therefore, it is preferably to use solder balls with a diameter d1, d2 up to 500 microns. Most preferred are solder balls with a diameter d1, d2 of 300 microns. This is a common diameter for commercially widely available solder balls. It is preferred, but not required, that a diameter d1 of first solder balls 451 is the same as a diameter d2 of second solder balls 452.

The closer solder balls 451 and 452 are with respect to each other, the stronger the mechanical strength and electric path is after fusing. However, more energy may be needed to fuse the solder balls together. A particularly suitable configuration that balances mechanical strength, electronic conductivity, and processing properties for a radiation detector element 2 according to the present invention, is when the solder balls 451, 452 have a diameter d1, d2 of 300 microns, a gap c between the perpendicular piece 42 and substrate 41 is 140 microns, a distance a between a middle of the first solder ball 451 and the substrate 41 is 280 micron and a distance b between a middle of the second solder ball 452 and the perpendicular piece 42 is 300 microns. There may be a variation of 10% for each of the distances a, b, c in each direction to optimally benefit from this configuration.

Figure 5:
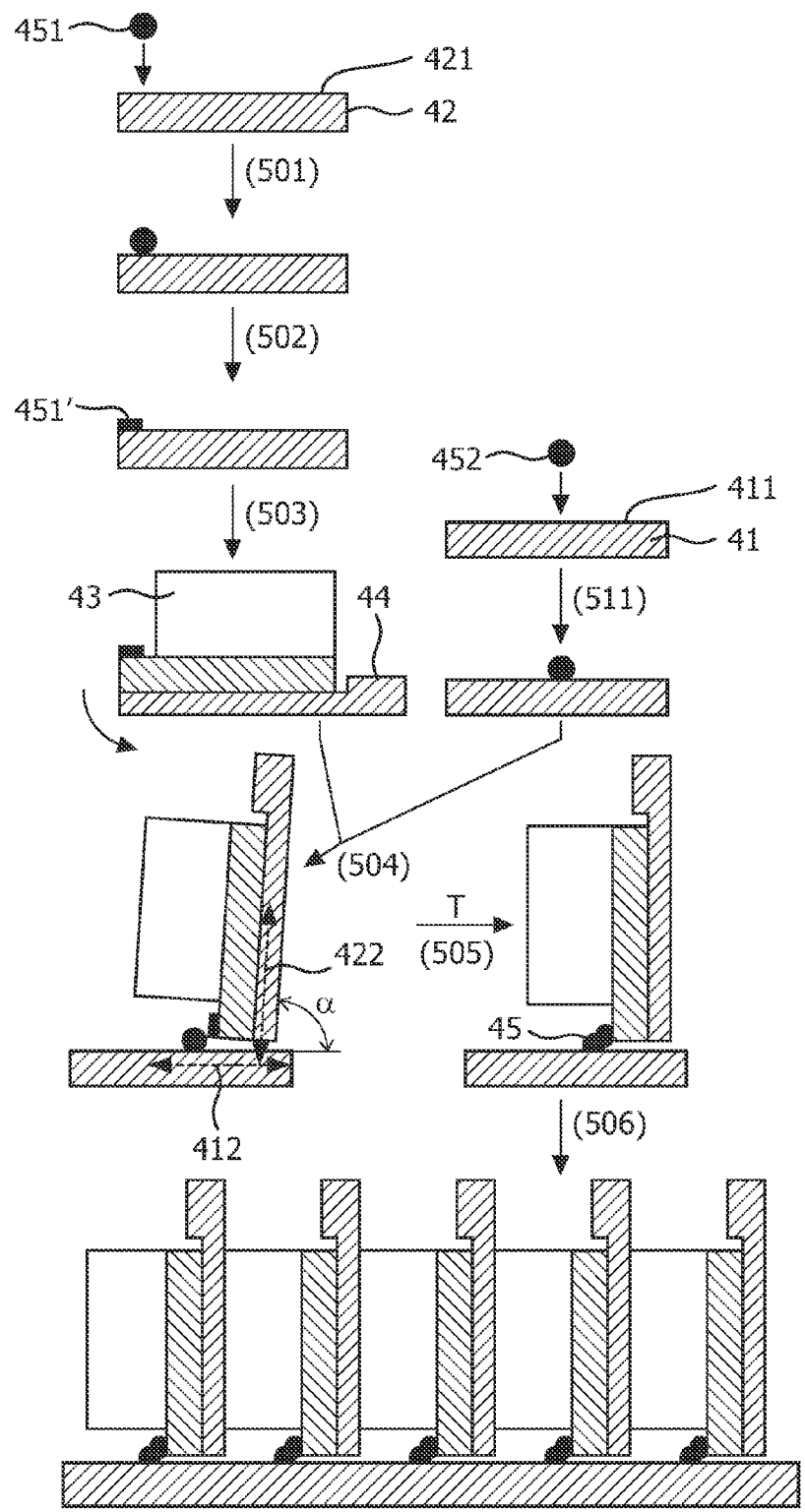
FIG. 5 shows a schematic depiction of a method to transversely attach two pieces according to the present invention.

FIG. 5 depicts a schematic representation of a method to transversely attach a first piece to a second piece according to the present invention using constructing a radiation detector element as a non-limiting example.

In step 501 first solder balls 451 are applied to the main surface 421 of the first piece 42, in this example this may be a photodiode. In this example 36 first solder balls 451 with a diameter of 300 microns are applied with a spacing of 500 microns along a row along a side of the first piece 42 approximately 150 microns from the side of the first piece. The first solder balls 451 may be applied using various application techniques, such as printing techniques (e.g. inkjet-like techniques), stenciling techniques, stamping techniques or any other technique common to the skilled person. In this example the solder balls 451 were stenciled onto the first main surface 421 of the first piece 42.

In step 511, which may be performed before, simultaneous with or subsequent to the previous step, a row of second solder balls 452 are applied to a main surface 411 of the second piece 41. The same or similar application techniques may be used as mentioned for the previous step. Spacing between the second solder balls 452 in the row should be as much the same as practically possibly as a spacing between the first solder balls 451 in the row near the side of the first piece. Preferably there is a variation of less than 1 percent. Most preferably they are exactly the same. This ensures a good spatial orientation between the first solder balls 451 and the second solder balls 452. This allows for proper alignment, which should result in an optimal connection strength and electrical conductivity. In this example 36 500 micron spaced second solder balls with a 300 micron diameter were applied to the second piece, which in this example detector element substrate 21. The second solder balls were in this case applied using a jetting (e.g. a ball drop) technique, because there is no solder stop on the main surface of 411 the substrate 21.

In step 502 at least one of the first solder balls 451 or second solder balls 452 are flattened to a disc-like shape. This is known in the field as coining. The solder balls are flattened to ensure that the first solder balls 451 will fuse optimally to the second solder balls 452 in heating step 505. When a flattened solder ball is melted it will have a tendency, due to its surface energy, to reduce its free surface by reverting back to a spherical shape. When thusly expanding flattened molten solder balls encounter the other solder balls they will wet more efficiently and generate a larger contact surface compared to the case where both the first and second solder balls would have had a spherical shape all the time, since in that situation there would be no significant drive to coalesce on forehand. It is preferred to coin the first solder balls 451 (see also FIG. 3, wherein a flattened first solder ball 451' is depicted), since they will usually be in a non-horizontal configuration during heating and the coined solder balls will therefore, due to gravity, expand more efficiently towards the second molten solder ball 452 then if it were the other way around. It is possible, but not required to flatten both the first and second solder balls. Any flattening technique known to the skilled person may be used to coin the solder balls, but a preferred method is to press the solder balls with a heated press at a temperature below the melting temperature of the to be coined solder balls. This facilitates pressing at limited pressing forces, while the solder balls still are relatively strong and immobile on the piece and results in well-defined and stable coins. The solder balls are preferably flattened to approximately one third of their original diameter (with a variation of 10 percent). This results in a good balance between flattening force and wetting properties. In the present example the first solder balls 451 are flattened using a pressing temperature just below the melting point of the first solder balls 451' to obtain coins with a thickness between 90 and 100 microns. The second solder balls 452 are not coined in this example.

In step 503, additional materials or layers 43 may be applied to the first piece. In this example a photo-conversion layer, specifically a scintillator layer 23, which may be a scintillator layer comprising a first scintillator material 231 stacked against a second scintillator material 232 is applied to one side of photodetector 22 and a tungsten shielding layer 24 is attached to an opposite side of the photodetector 22. Both layers may be attached using adhesives, in particular optical adhesives. A skilled person would understand that for other applications no or different types of additional layers or materials may be attached to the first piece 42 or to the second piece 41.

In step 504, the main axis 422 of the first piece 42 and a main axis 412 of the second piece 41 are positioned such that they are transverse, at an angle α. The angle α depends on the required final position (after heating). Due to shrinkage because of the fusing of the solder balls it is necessary to position the first and second piece at a slightly smaller angle than the required end position. The first piece 42 and second piece 41 should be further positioned such that each of the first solder balls 451 in the row of first solder balls on the first piece 42 is at least near to one of the second solder balls 451 in the row of second solder balls 452 on the second piece 42. It is allowed, but not necessary that the first and second solder balls touch. The distance should be determined by ensuring that the flattened solder ball will sufficiently wet the other solder ball when it expands upon a heating. Therefore the distance should preferably be smaller than a radius of one of the solder balls. In the present example the angle α is 89.5 degrees, which results in a nearly exactly perpendicular orientation of the photodiode 22 with respect to the substrate 21 after fusing. The distance between the flattened first solder ball 451' and second solder ball is less than an original (pre-flattened) radius of both solder balls.

In step 505 both solder balls are heated above their melting temperature to allow them to fuse. The temperature should be balanced between sufficiently high to ensure a fast fusing process and a short exposure time and low enough to avoid thermal damage to other components. Heating may be done in various ways, e.g. a (short) stay in a heated atmosphere, contacting the solder balls with a heated element or, preferably, using laser heating. With laser heating it is possible to heat the solder balls accurately and within a short, well-defined time period which results in slim connections which still allow for some elasticity. The exposure time may be controlled by using a shutter system to alternatively block an emitted laser beam and let it pass. Also a pulsed laser system may be used. The laser beam may be widened, e.g. by using a lens system, to allow concerted illumination of a whole row of first and second solder balls. This eliminates the use of accurate beam positioning systems or multiple laser beams. Any laser system may be used, as long as the solder balls absorb sufficient laser energy to raise the temperature of the solder balls above their melting temperature(s). Preferably the first and second pieces are held in their oriented position during heating (e.g. by keeping them in means used for positioning). After heating the solder balls are allowed to cool and stiffen into their final position.

As illustrated in step 506, this process may be repeated to transversely apply more first pieces 42 to second pieces 41 in order to make a radiation detector according the present invention. Usually 16 photodiodes 22 are applied to a detector element substrate 21. It is not necessary to repeat each of the previous steps in sequence. For instance, it is beneficial to apply p rows of second solder balls 452 on the second substrate 41 (p>1, preferably p=16) and perform steps 501 to 503 for p first pieces 42 before positioning and heating.

While the invention has been illustrated and described in detail in the drawings and foregoing description, such illustration and description are to be considered illustrative or exemplary and not restrictive; the invention is not limited to the disclosed embodiments.

Any structure obtainable by a method comprising at least steps 501, 511, 502, 504 and 505 is considered to fall under the scope of this invention. Also, a device for perpendicular attaching two pieces capable of carrying out the method according to the present invention (therefore including at least means for depositing first and second solder balls, positioning means for transversely positioning the two pieces and heating means) falls under the scope of the present invention. The radiation detector may also be a direct conversion radiation detector, wherein the scintillator material is replaced by direct conversion material, such as CZT or CdTE, and instead of a photodiode an alternate vertical structure (e.g. a support strip or a computer chip attached to the direct conversion material) is used.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A radiation detector element, comprising:
   at least one photodiode having a first main surface extending along a first main axis; and
   a detector element substrate having a second main surface extending along a second main axis which is oriented transversally with respect to the first main axis,
   wherein the photodiode is in electrical contact with the detector element substrate through at least one connection, wherein the connection comprises two fused solder balls, wherein the two fused solder balls are directly soldered to one another, and wherein a first of the two fused solder balls directly contacts the photodiode and a second of the two fused solder balls directly contacts the detector element substrate.

2. The radiation detector element according to claim 1, wherein the first main axis of the photodiode is oriented substantially perpendicular with respect to the second main axis of the detector element substrate.

3. The radiation detector element according to claim 1, wherein a composition of the first solder ball and/or the second solder ball comprises Bismuth, preferably a Bismuth-Tin alloy or a Bismuth-Tin-Indium alloy.

4. The radiation detector element according to claim 1, further comprising:
   a scintillating material coupled to the photodiode, wherein the scintillating material preferably comprises two stacked scintillating layers.

5. The radiation detector element according to claim 1, further comprising:
   a radiation shielding element coupled to the photodiode, preferably a shielding element comprising tungsten.

6. The radiation detector element according to claim 1, further comprising:
   at least 32 connections, preferably comprising at least 36 connections, and, comprising at least 16 photodiodes.

7. The radiation detector element according to claim 1, wherein the first main surface lies in a first plane and the second main surface lies in a second plane, said first plane and second plane are aligned transversely with respect to each other.

8. A medical imaging device, such as a computed tomography device, comprising at least one radiation detector element according to claim 1.

* * * * *